United States Patent
Hanrahan

(10) Patent No.: US 7,343,140 B2
(45) Date of Patent: Mar. 11, 2008

(54) TUNER

(75) Inventor: Robert Mason Hanrahan, Montvale, NJ (US)

(73) Assignee: Intel Corporation, Santa Clara, CA (US)

( * ) Notice: Subject to any disclaimer, the term of this patent is extended or adjusted under 35 U.S.C. 154(b) by 1146 days.

(21) Appl. No.: 10/410,915

(22) Filed: Apr. 10, 2003

(65) Prior Publication Data

US 2004/0204034 A1    Oct. 14, 2004

(51) Int. Cl.
*H04B 7/08* (2006.01)

(52) U.S. Cl. .................. 455/130; 455/142; 455/176.1; 455/180.1; 455/190.1

(58) Field of Classification Search ................ 455/130, 455/142, 176.1, 180.1, 180.3, 190.1, 127.4, 455/132

See application file for complete search history.

(56) References Cited

U.S. PATENT DOCUMENTS

| | | | |
|---|---|---|---|
| 5,784,413 A * | 7/1998 | Chen .......................... 375/308 |
| 6,556,807 B1 * | 4/2003 | Horie et al. ................ 455/3.02 |
| 6,920,185 B2 * | 7/2005 | Hinson ........................ 375/295 |
| 2003/0054850 A1 * | 3/2003 | Masseroni et al. .......... 455/522 |

\* cited by examiner

*Primary Examiner*—Sanh D. Phu
(74) *Attorney, Agent, or Firm*—Blakely, Sokoloff, Taylor & Zafman LLP

(57) ABSTRACT

A tuner is provided for selecting, independently of each other, a plurality of radio frequency channels for simultaneous reception. The tuner comprises a plurality of up converters whose outputs are combined in a combiner. Each up converter operates independently of the other up converters to select a channel from a multi channel input signal and to convert the selected channel to a first high intermediate frequency. The intermediate frequencies of the up converters are different from each other. The common signal from the combiner is supplied to a down converter which converts the signals at different high intermediate frequencies to signals at different lower intermediate frequencies. Thus, the signals from the combiner and from the down converter carry all of the selected channels at different intermediate frequencies. The signal from the down converter is subsequently processed to separate the selected channels and demodulate them. This may be achieved by a common demodulation circuit, which processes channels simultaneously.

19 Claims, 7 Drawing Sheets

TUNER

TECHNICAL FIELD

The present invention relates to a tuner for selecting, independently of each other, a plurality of radio frequency channels for simultaneous reception. Such a tuner may be used to receive simultaneously two or more radio frequency channels carrying analog and/or digital information where each channel can be selected independently of the selection of any other channel. The signals may carry audio, television video, or data signals or any combinations thereof.

BACKGROUND

EP 0 945 990 discloses a multi-band GSM mobile telephone which is capable of providing reception in any one of two or more bands. Down conversion of a channel to different intermediate frequencies is disclosed. However, this telephone is capable of receiving only one channel at a time.

U.S. Pat. No. 6,272,430 discloses a GPS receiver in which the signals from all in-view satellites are processed in a radio frequency/intermediate frequency block. However, only a single signal at a time can be received.

Various other types of known tuners are disclosed in U.S. Pat. No. 5,966,646, U.S. Pat. No. 6,052,569, U.S. Pat. No. 6,151,488 and U.S. Pat. No. 6,208,844.

SUMMARY

According to the invention, there is provided a tuner for selecting independently of each other a plurality of radio frequency channels for simultaneous reception, comprising; a plurality of up converters, each of which is arranged to select, independently of the or each other up converter, a channel from a multi channel input signal and to convert the selected channel to a respective first intermediate frequency higher than the frequency band of the multi channel input signal, the first intermediate frequencies being different from each other; a combiner for combining the selected channels at the first intermediate frequencies from the up converters into a common signal; and a down converter for converting the common signal to a lower frequency range with the selected channels being converted to respective different second intermediate frequencies.

At least one of the up converters may be arranged to receive a different input signal from at least one other of the up converters.

At least two of the up converters may be arranged to receive the same input signal.

The plurality of up converters may comprise two up converters.

The selected channels at the first intermediate frequencies may be adjacent but non-overlapping in the frequency domain.

The tuner may comprise a respective first intermediate frequency filter between each of the up converters and the combiner.

The tuner may comprise a respective second intermediate frequency filter for each of the second intermediate frequencies, each of the second filters being arranged to receive the common signal.

The tuner may comprise a single second intermediate frequency filter for filtering the common signal, the second filter having a passband sufficiently wide to pass all of the selected channels at the second intermediate frequencies.

The tuner may comprise a single demodulator arrangement for demodulating the common signal and for separating the selected channels. The single demodulator arrangement may comprise a single analog/digital converter for converting the common signal to the digital domain and a digital signal processor for demodulating and separating the selected channels.

BRIEF DESCRIPTION OF THE DRAWINGS

Like reference numbers refer to like parts throughout the drawings.

DETAILED DESCRIPTION

Figure 1:
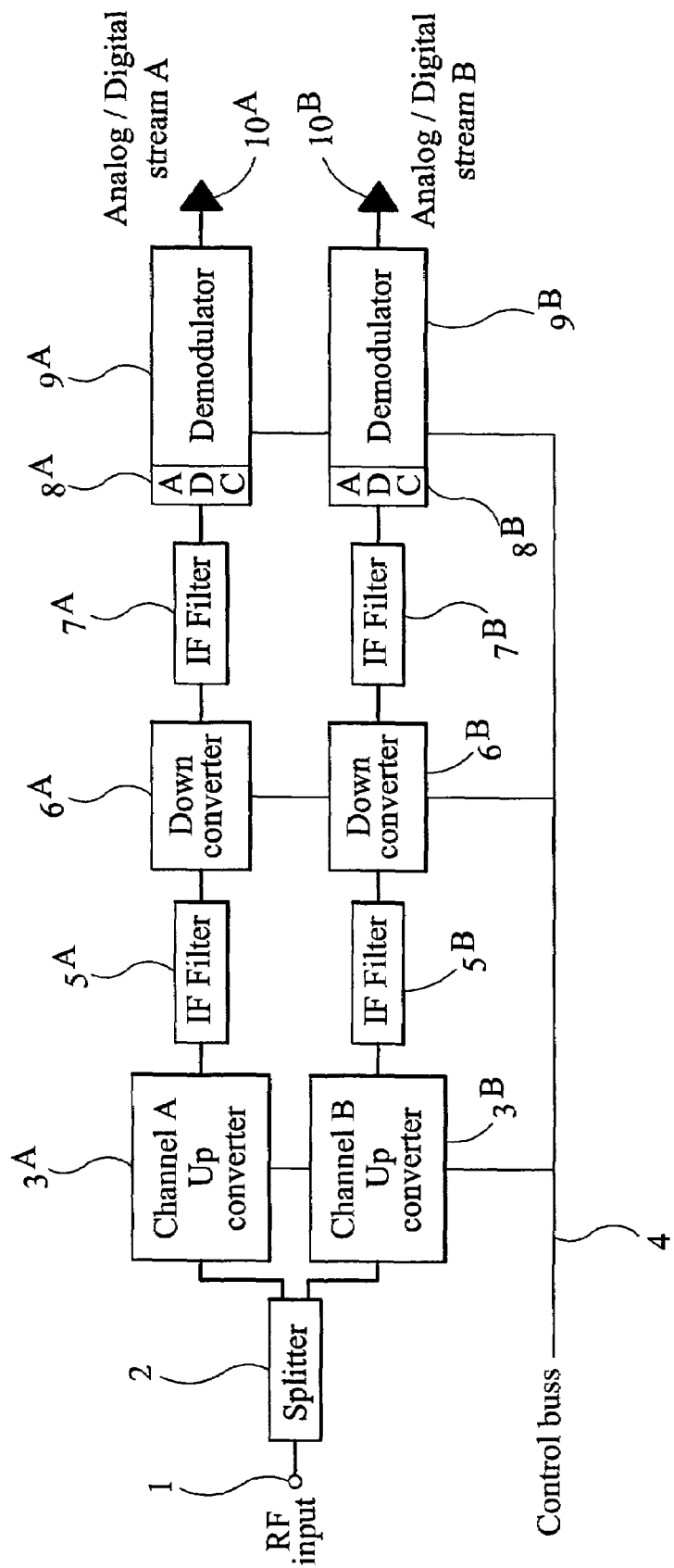
FIG. 1 is a block schematic diagram of a known type of tuner.

FIG. 1 illustrates a known type of tuner arrangement for simultaneously receiving two channels which may be selected independently of each other. Such an arrangement may be used, for example, in an integrated receiver decoder (IRE) or in a set-top box (STB), for example for receiving television signals from a terrestrial or satellite aerial arrangement or from a cable distribution network. The arrangement comprises a radio frequency (RF) input 1 connected to the input of a signal splitter 2. The splitter 2 is arranged to supply substantially identical signals to the inputs of two largely independent tuners.

The first tuner comprises an up converter 3A for converting a selected channel to a high first intermediate frequency (IF) which is above the frequency spectrum of the input signal received by the up converter 3A. In a typical example, the up converter 3A comprises a mixer having a first input for receiving the multi channel input signal and a second input for receiving a local oscillator signal from a local oscillator controlled by a phase locked loop. The phase locked loop controls the frequency of the local oscillator in accordance with a signal received from a control bus 4 for allowing user-selection of the channel A for reception.

The output of the up converter 3A is supplied to a first IF filter 5A of bandpass type having a passband intended to be centred on the first IF and sufficiently wide to pass the selected channel A at the first IF. The filter 5A has a passband which is such that channels adjacent to the selected channel A at the first IF may also be passed with relatively little attenuation.

The filtered signal from the filter 5A is supplied to a down converter 6A, which is generally of the same type as the up converter 3A but mixes the incoming signal with a fixed frequency local oscillator signal to convert the selected channel to a second intermediate frequency, which is much lower than the first IF. The output signal of the down converter 6A is supplied to a second IF filter 7A of bandpass type having a passband centred on the second IF and sufficiently narrow to pass the selected channel A at the second IF but substantially to reject all other channels at the output of the down converter 6A. The output signal of the second IF filter 7A is supplied to a demodulator arrangement which may be of analog type or, as shown, of digital type comprising an analog/digital converter (ADC) 8A and a digital demodulator 9A. The demodulator 9A supplies at its output 10A an analog and/or digital stream A, for example comprising audio and video signals for reproduction by a suitable display and audio system.

The second tuner is substantially identical to the first tuner and corresponding blocks are referred to by the same reference numeral but with a subscript "B" instead of "A".

Apart from sharing a common control bus 4 and receiving the same multi channel input signal, the two tuners are essentially independent of each other. In general, the two tuners use the same first and second intermediate frequencies as each other although this is not actually essential.

Figure 2:
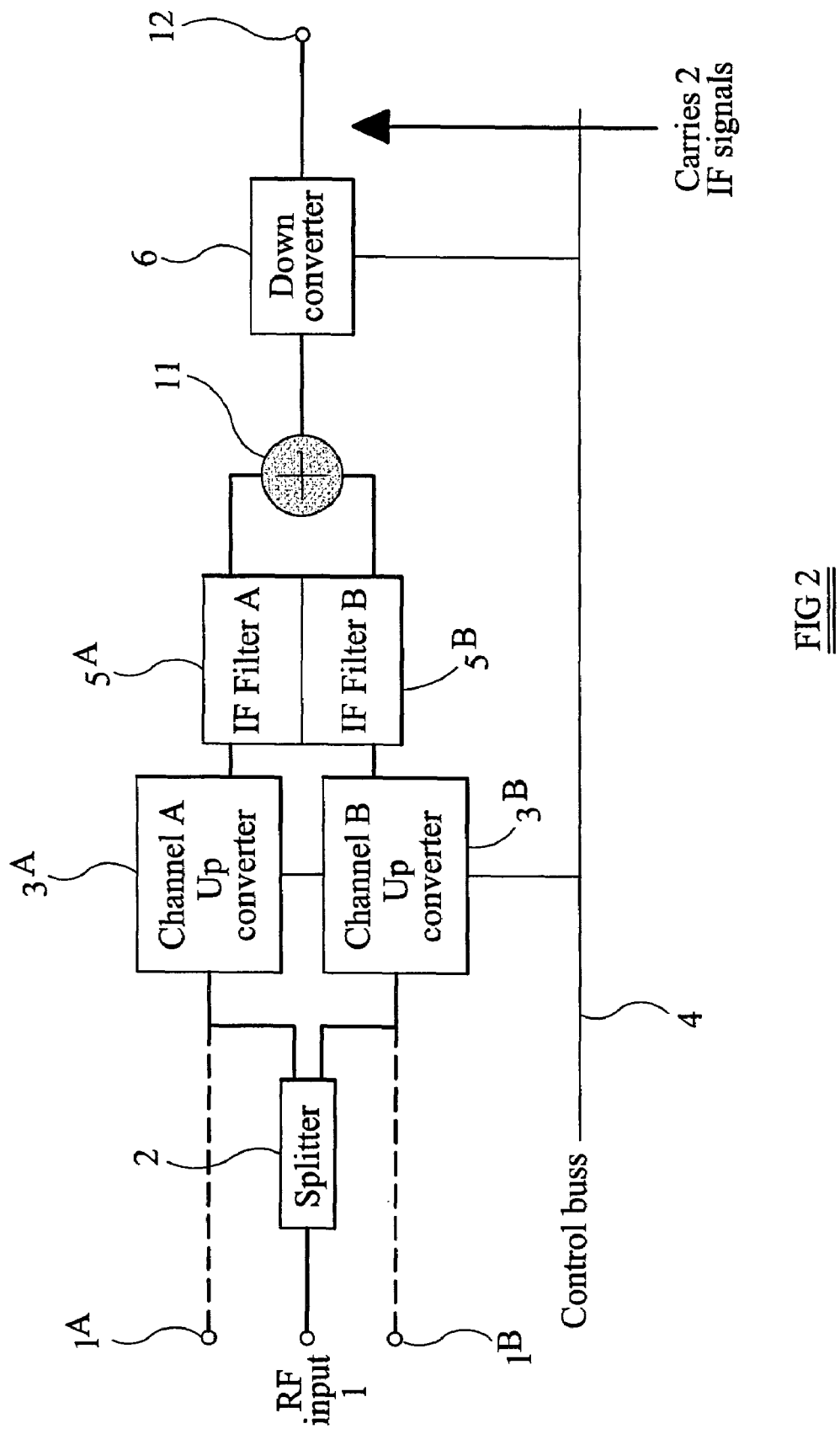
FIG. 2 is a block schematic diagram of a tuner constituting a first embodiment of the invention.

FIG. 2 illustrates a tuner which may also be used for simultaneously receiving two channels which are selected independently of each other. A single RF input 1 and signal splitter 2 of the type shown in FIG. 1 are illustrated in FIG. 2 but an alternative arrangement is illustrated by broken lines whereby different inputs 1A and 1B for the two channels are provided so that, for example, channel A may be selected from a cable distribution network and channel B may be selected from a terrestrial or satellite broadcast.

Figure 3:
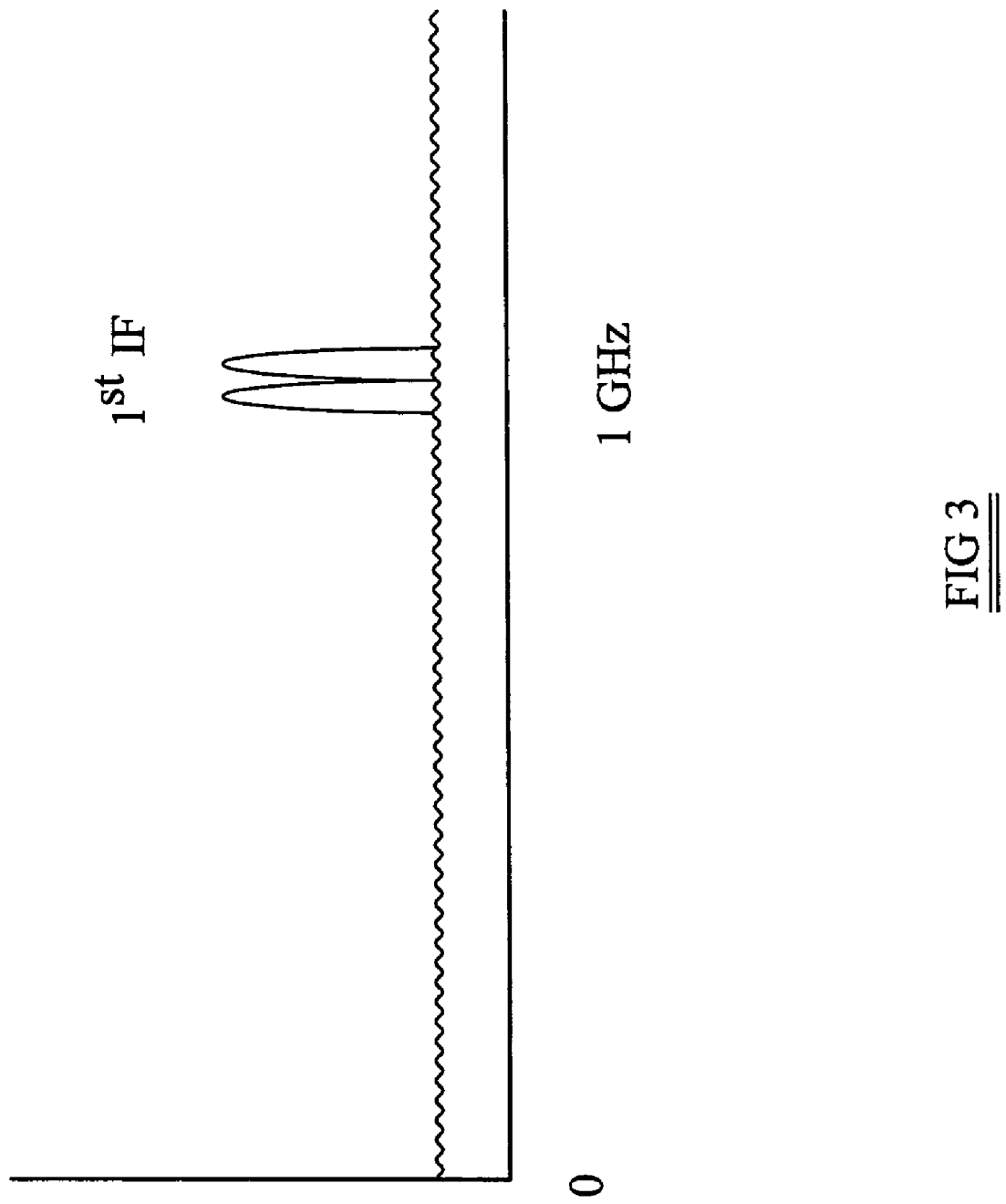
FIG. 3 is a graph of amplitude against frequency illustrating an example of a signal spectrum following up conversion in the tuner of FIG. 2.

The tuner of FIG. 2 comprises up converters 3A and 3B which may be of a type similar to those illustrated in FIG. 1. However, as shown in FIG. 3, the up converters 3A and 3B are controlled via the control bus 4 such that the selected channels A and B are converted to different high first intermediate frequencies. The first IFs are close to each other but different such that the spectrums of the selected channels A and B at their first IFs are adjacent but non-overlapping The output signals of the up converter 3A and 3B are supplied to first IF filters 5A and 5B, respectively, of the same type as the corresponding filters shown in FIG. 1 but either with nominally different passband centre frequencies corresponding to the different IFs or with sufficiently wide passbands of the same centre frequency such that the filter 5A passes the channel A at its IF and the filter 5B passes the channel B at its IF. The outputs of the filters 5A and 5B are supplied to a combiner 11, which effectively adds the output signals of the filters so as to form a common signal having the spectrum illustrated in FIG. 3. The common signal is supplied to a single down converter 6, which converts the common signal to a lower frequency range and, in particular, converts each of the channels A and B to respective different second intermediate frequencies. The down converter 6 is connected to an output 12 for supplying the channels A and B at their respective second intermediate frequencies for further processing, which ultimately results in the individual channels being separated from each other and demodulated.

Although the tuner shown in FIG. 2 and in subsequent drawings is capable of simultaneously receiving two channels which can be selected independently of each other, in principle, tuners may be provided for receiving any number of channels simultaneously and selected independently of each other. For each channel, it is basically necessary to provide a corresponding up converter and first IF filter with the combiner 11 being arranged to combine the outputs of all of the filters. In practice, the number of channels which may be selected simultaneously and independently of each other by this type of arrangement is limited by various factors, such as the maximum frequency capability of a following analog/digital converter. However, it is possible to achieve a substantial reduction in cost and size by using the tuner of FIG. 2 in place of a conventional or known tuner, for example of the type shown in FIG. 1. For example, by using a single down converter instead of one down converter for each channel to be received simultaneously, a considerable saving in space and cost can be achieved. Although it is necessary to provide some type of combiner 11 for summing the first IF signals, such a combiner requires relatively little space, for example, in an integrated circuit, and occupies much less space than a down converter. Also, the power consumption is substantially reduced as the combiner 11 requires much less power consumption than a down converter.

Figure 4:
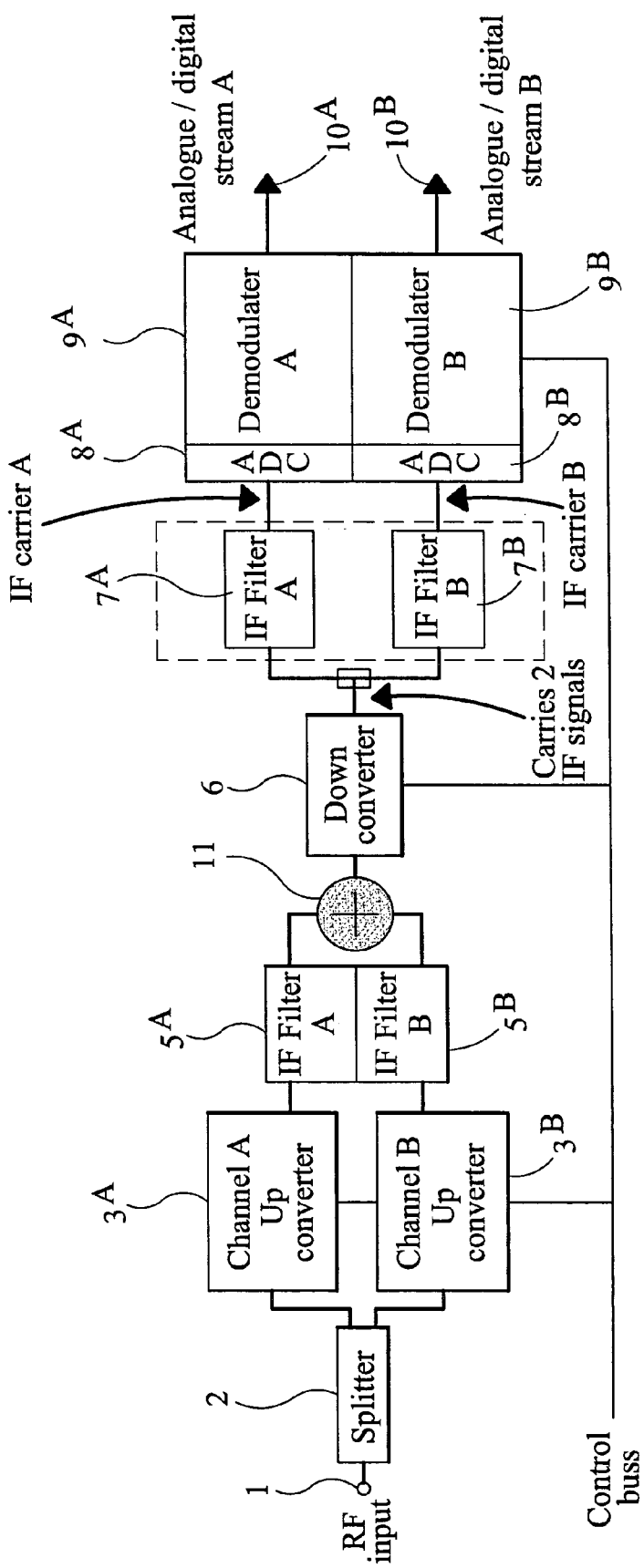
FIG. 4 is a block schematic diagram of a tuner constituting a second embodiment of the invention.

FIG. 4 illustrates the use of a tuner of the type shown in FIG. 2 with an arrangement for separating and demodulating the common signal supplied by the down converter 6. The common signal carrying the two channels A and B at the different second intermediate frequencies is supplied to the inputs of filters 7A and 7B, which are of the same type as the filters shown in FIG. 1 but which have respective passband centre frequencies at the respective second intermediate frequencies. Thus, the filter 7A passes the channel A but substantially rejects the channel B whereas the filter 7B passes the channel B but substantially rejects the channel A. The separated channels A and B at their respective second intermediate frequencies are then supplied to ADCs 8A and 8B and demodulators 9A and 9B, for example of the types illustrated in FIG. 1.

Figure 5:
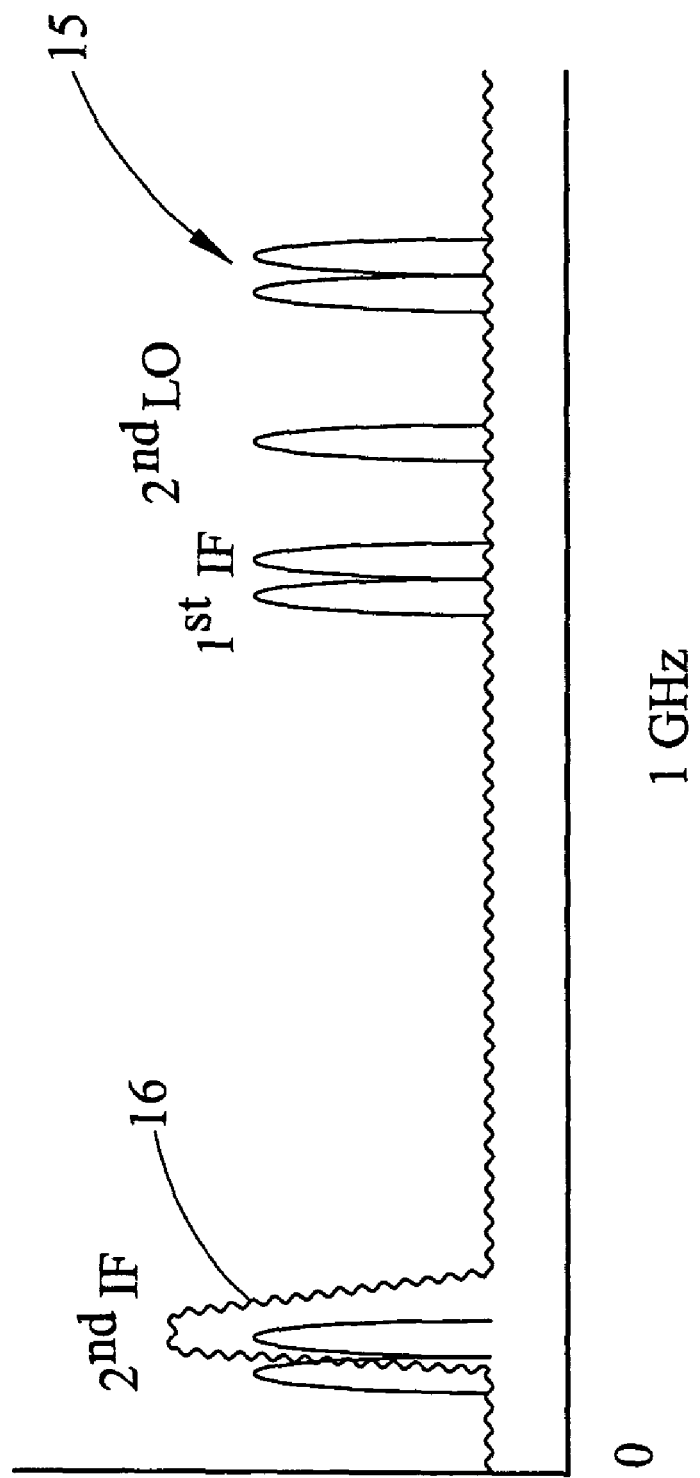
FIG. 5 is a graph of amplitude against frequency illustrating a frequency spectrum following down conversion in the tuner of FIG. 4.

FIG. 5 illustrates the spectrum of the channels A and B at their first IFs, the frequency of the second local oscillator (LO) in the down converter 6, and the channels at their second IFs. The image channels for the down conversion are also illustrated at 15 but these can be rejected by providing the filters 5A and 5B with the appropriate characteristics and/or by embodying the down converter 6 with an image reject mixer. FIG. 5 also illustrates at 16 the passband of one of the filters 7A and 7B. The passbands of these filters are required, as described hereinbefore, to separate the channels A and B from each other for subsequent processing to extract the output streams A and B.

Figure 6:
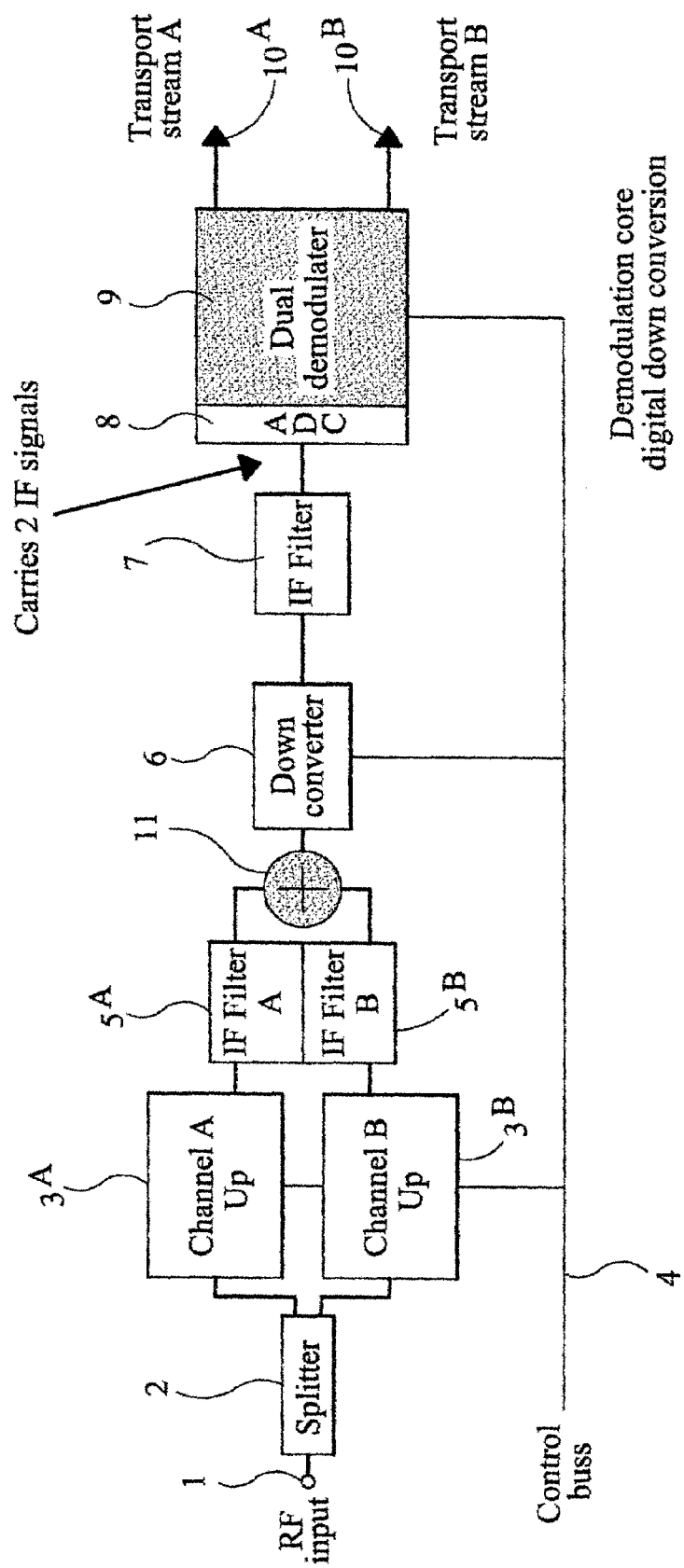
FIG. 6 is a block schematic diagram of a tuner constituting a third embodiment of the invention.
Figure 7:
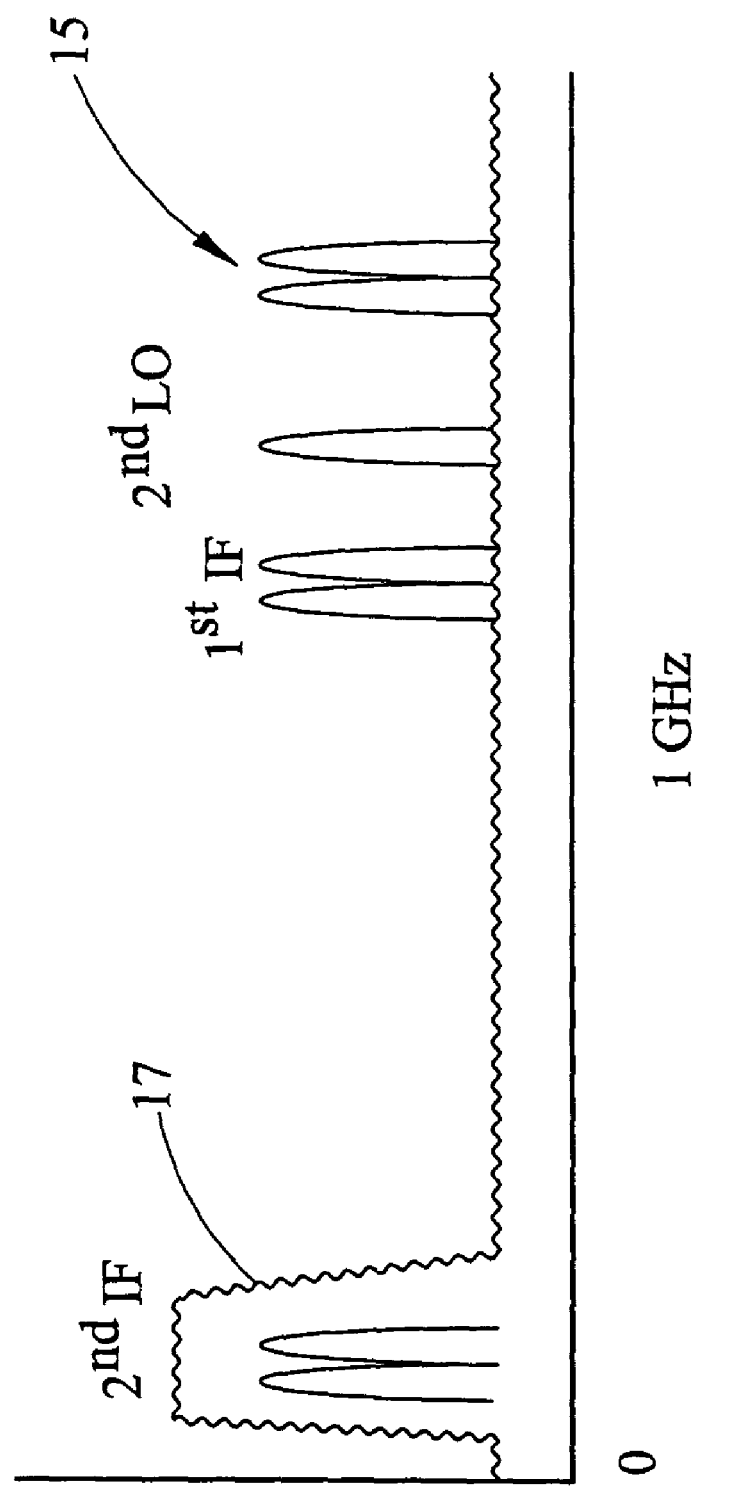
FIG. 7 is a graph of amplitude against frequency illustrating a frequency spectrum following down conversion in the tuner of FIG. 6.

FIG. 6 illustrates an alternative arrangement using a tuner of the type shown in FIG. 2. In this case, the output of the down converter 6 is supplied to a single second IF filter 7 having a passband as illustrated at 17 in FIG. 7. In particular, the second IF filter passband 17 is sufficiently wide to pass both of the channels A and B at their second IFs but substantially rejects any signals present in the common signal outside this passband. The filtered common signal carrying both of the IF signals is supplied to a single ADC 8 and "dual demodulator" 9. The ADC 8 converts the signal comprising the sum of channels A and B at their second IFs to the digital domain, where channel separation and demodulation to provide the output transport streams A and B are performed by a digital signal processor (DSP) embodying the demodulator 9. Thus, separate second IF filters 7A and 7B may be replaced by a single filter 7, separate ADCs 8A and 8B may be replaced by a single ADC 8, and separate demodulators 9A and 9B may be replaced by a single arrangement 9. Further substantial savings in cost, size and power consumption may therefore be made.

Although the dual demodulator 9 is required to be capable of separating the channels and providing, for example, down conversion, demodulation and forward error correction for two (or more) channels, a substantial saving in cost, size and power consumption can be made compared with providing two (or more) separate demodulators such as 9A and 9B. The use of a single second IF filter 7 and a single ADC 8, which need be little or no bigger than the individual filters and ADCs shown in FIG. 4, allows substantial savings to be made. It is thus possible to provide an effective and efficient RF "front-end" for simultaneous multiple channel reception, for example in what is know as "soft radio" applications. Digital signal processing within the demodulator 9 may additionally be used to remove or substantially reduce unwanted images or energy falling within the passbands of the IF filters. Such tuners may therefore be used with advantage in television receivers, video cassette recorders such as personal video recorders, and in other digital video and data applications.

What is claimed is:

1. A tuner for selecting independently of each other a plurality of radio frequency channels for simultaneous reception, comprising;
    a plurality of up converters, each of which is arranged to select, independently of each other of said up converters, a channel from a multi channel input signal and to convert said selected channel to a respective first intermediate frequency higher than a frequency band of said multi channel input signal, said respective first intermediate frequencies being different from each other, said selected channels at said respective first intermediate frequencies are adjacent but non-overlapping in a frequency domain;
    a combiner for combining said selected channels at said respective first intermediate frequencies from said up converters into a common signal; and
    down converter for converter said common signal to a lower frequency range with said selected channels being converted to respective different second intermediate frequencies.

2. A tuner as claimed in claim 1, in which at least one of said up converters is arranged to receive a different input signal from at least one other of said up converters.

3. A tuner as claimed in claim 1, in which at least two of said up converters are arranged to receive a same input signal.

4. A tuner as claimed in claim 1, in which said plurality of up converters comprises two up converters.

5. A tuner as claimed in claim 1, comprising a single second intermediate frequency filter for filtering said common signal, said second filter having a passband sufficiently wide to pass all of said selected channels at said respective second inter-mediate frequencies.

6. A tuner as claimed in claim 5, comprising a single demodulator arrangement for demodulating said common signal and for separating said selected channels.

7. A tuner as claimed in claim 6, in which said single demodulator arrangement comprises a single analog/digital converter for converting said common signal to a digital domain and a digital signal processor for demodulating and separating said selected channels.

8. A tuner for selecting independently of each other a plurality of radio frequency channels for simultaneous reception, comprising;
    a plurality of up converters, each of which is arranged to select, independently of each other of said up converters, a channel from a multi channel input signal and to convert said selected channel to a respective first intermediate frequency higher than a frequency band of said multi channel input signal, said respective first intermediate frequencies being different from each other;
    a respective first intermediate frequency filter between each of said up converters and said combiner;
    a combiner for combining said selected channels at said respective first intermediate frequencies from said up converters into a common signal; and
    down converter for converter said common signal to a lower frequency range with said selected channels being converted to respective different second intermediate frequencies.

9. A tuner as claimed in claim 8, in which at least one of said up converters is arranged to receive a different input signal from at least one other of said up converters.

10. A tuner as claimed in claim 8, in which at least two of said up converters are arranged to receive a same input signal.

11. A tuner as claimed in claim 8, in which said plurality of up converters comprises two up converters.

12. A tuner as claimed in claim 8, comprising a single second intermediate frequency filter for filtering said common signal, said second filter having a passband sufficiently wide to pass all of said selected channels at said respective second inter-mediate frequencies.

13. A tuner for selecting independently of each other a plurality of radio frequency channels for simultaneous reception, comprising:
    a plurality of up converters, each of which is arranged to select, independently of each other of said up converters, a channel from a multi channel input signal and to convert said selected channel to a respective first intermediate frequency higher than a frequency band of said multi channel input signal, said respective first intermediate frequencies being different from each other;
    a combiner for combining said selected channels at said respective first intermediate frequencies from said up converters into a common signal;
    down converter for converter said common signal to a lower frequency range with said selected channels being converted to respective different second intermediate frequencies; and
    a respective second intermediate frequency filter for each of said respective second intermediate frequencies, each of said second filters receiving said common signal.

14. A tuner as claimed in claim 13, comprising a single demodulator arrangement for demodulating said common signal and for separating said selected channels.

15. A tuner as claimed in claim 14, in which said single demodulator arrangement comprises a single analog/digital converter for converting said common signal to a digital domain and a digital signal processor for demodulating and separating said selected channels.

16. A tuner as claimed in claim 13, in which at least one of said up converters is arranged to receive a different input signal from at least one other of said up converters.

17. A tuner as claimed in claim 13, in which at least two of said up converters are arranged to receive a same input signal.

18. A tuner as claimed in claim 13, in which said plurality of up converters comprises two up converter.

19. A tuner as claimed in claim 13, comprising a single second intermediate frequency filter for filtering said common signal, said second filter having a passband sufficiently wide to pass all of said selected channels at said respective second inter-mediate frequencies.

* * * * *